United States Patent
Shimizu et al.

(10) Patent No.: US 6,950,334 B2
(45) Date of Patent: Sep. 27, 2005

(54) MAGNETIC RANDOM ACCESS MEMORY HAVING TEST CIRCUIT AND TEST METHOD THEREFOR

(75) Inventors: Yuui Shimizu, Yokohama (JP); Yoshihisa Iwata, Yokohama (JP); Kenji Tsuchida, Kawasaki (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

(21) Appl. No.: 10/728,917

(22) Filed: Dec. 8, 2003

(65) Prior Publication Data

US 2005/0047202 A1 Mar. 3, 2005

(30) Foreign Application Priority Data

Aug. 25, 2003 (JP) .......................... 2003-300493

(51) Int. Cl.[7] .......................... G11C 11/14; G11C 11/15; G11C 29/00
(52) U.S. Cl. .......................... 365/158; 365/171; 365/173; 365/200; 365/201
(58) Field of Search .................................. 365/171, 173, 365/200, 201, 158

(56) References Cited

U.S. PATENT DOCUMENTS

| | | | | |
|---|---|---|---|---|
| 6,256,224 B1 | * | 7/2001 | Perner et al. | 365/173 |
| 6,584,589 B1 | * | 6/2003 | Perner et al. | 714/721 |
| 6,606,262 B2 | * | 8/2003 | Perner | 365/158 |
| 6,751,147 B1 | * | 6/2004 | Smith et al. | 365/225.5 |
| 6,791,873 B1 | * | 9/2004 | Perner | 365/158 |
| 6,850,430 B1 | * | 2/2005 | Perner | 365/158 |
| 2004/0042297 A1 | * | 3/2004 | Iwata et al. | 365/202 |

FOREIGN PATENT DOCUMENTS

JP  2001-273799  10/2001

* cited by examiner

*Primary Examiner*—Anh Phung
*Assistant Examiner*—J. H. Hur
(74) *Attorney, Agent, or Firm*—Oblon, Spivak, McClelland, Maier & Neustadt, P.C.

(57) ABSTRACT

An MRAM has an internal test circuit. This test circuit detects a bit in a memory cell array, which has a shift in write characteristics, as a defective bit by using a method of applying a one-axis write current along an axis of hard magnetization.

13 Claims, 13 Drawing Sheets

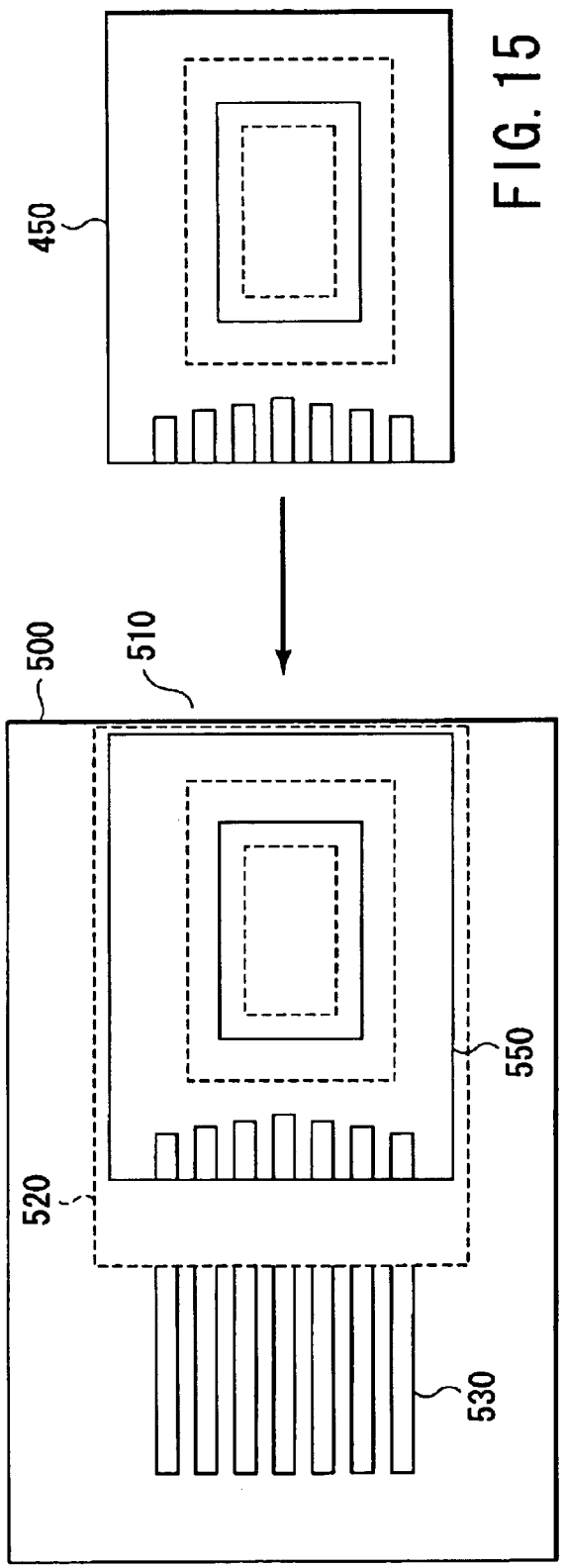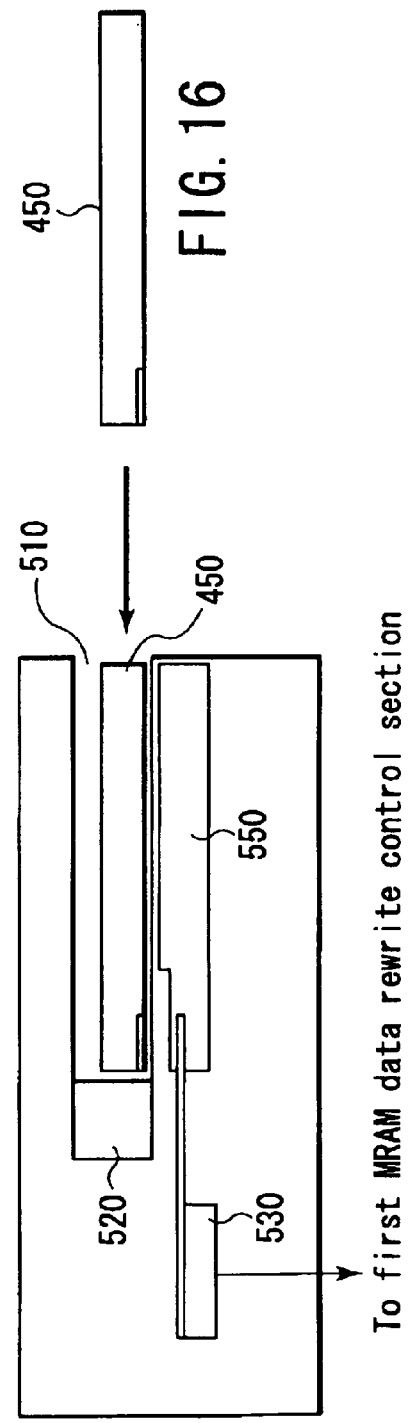

MAGNETIC RANDOM ACCESS MEMORY HAVING TEST CIRCUIT AND TEST METHOD THEREFOR

CROSS-REFERENCE TO RELATED APPLICATIONS

This application is based upon and claims the benefit of priority from the prior Japanese Patent Application No. 2003-300493, filed Aug. 25, 2003, the entire contents of which are incorporated herein by reference.

BACKGROUND OF THE INVENTION

1. Field of the Invention

The present invention relates to a magnetic random access memory (MRAM) as a nonvolatile memory using the tunneling magneto-resistive effect and a test method therefor and, more particularly, to a magnetic random access memory having a test circuit (internal test circuit) and a test method therefor.

2. Description of the Related Art

In semiconductor memories such as magnetic random access memories (MRAMs) including both single memories and embedded memories, it is very important to have, as a peripheral circuit, an internal test circuit capable of automatically discriminating a defective bit whose characteristic falls outside the standards of the memory cell characteristic and discriminating a defective chip in the early stages. This is because the test time at the time of test process in mass production can be shortened, i.e., the manufacturing cost can be kept low.

Jpn. Pat. Appln. KOKAI Publication No. 2001-273799 already proposes a resistor type test circuit which determines short and open in the memory cell array portion of an MRAM and also whether the resistance value of each magnetic tunneling junction (MTJ) element that forms a memory cell has a predetermined upper limit value or lower limit value.

It is also known, as the write characteristics of an MTJ element, that there are a shift to "1" data side by Neel coupling and a shift to "0" data side by a stray field.

More specifically, assume that an MTJ element has a desired resistance value. The write characteristics of the MTJ element that constitutes a memory cell is taken into consideration. If the asteroid characteristic of an MTJ element shifts to one of the axes of easy magnetization, a write error may be caused in a half-selected state (or semi-selected state), i.e., by a current for only one of the axis of easy magnetization (or easy axis) and the axis of hard magnetization (or hard axis).

For example, assume that when most memory cells (MTJ elements) in a memory cell array exhibit the asteroid characteristic as shown in FIG. 1A, a memory cell that exhibits the asteroid characteristic as shown in FIG. 1B exists. In a write mode to a normal memory cell, write currents are supplied to the bit and word lines such that a current magnetic field is generated at an intersection N1 between +Ia and +Ib or an intersection N2 between −Ia and +Ib. At this time, if a bit having the asteroid characteristic shown in FIG. 1B is present on the same word line as that of the bit that should be write-accessed, "1" data is erroneously written in the bit. Alternatively, the switching current for a write for one axis Ieasy is defined as +Ic. If a bit with "+Ic<+Ia" is present on the same bit line as that of the bit that should be write-accessed, "1" data is undesirably written in the bit.

Referring to FIGS. 1A and 1B, Ieasy and Ihard indicate currents necessary for generating current magnetic fields along the axes of easy magnetization and hard magnetization for an MTJ element that forms a memory cell.

As described above, assume that, in an MRAM which executes a two-axis write, different current values are necessary for generating magnetic fields along the axis of easy magnetization in writing "0" data and "1" data. That is, assume that the write characteristics shift. In this case, data write may be impossible for the bit. Alternatively, the memory cell may become weak against disturbance in the half-selected state. The disturbance means data changes in memory cells to which two-axis current magnetic fields are not applied. To increase the reliability of a memory, a bit having a shift in write characteristics must be excluded as a defective bit.

Examples of categories of defective bits in an MRAM are short of an MTJ element, a memory cell having a resistance value that falls outside the standards due to a failure in a tunnel insulating film, and an inappropriate write characteristics when a write mode is taken into consideration.

A bit whose resistance value of the MTJ element falls outside the standards or a bit having a shift in write characteristics should be determined as a defective bit in mass production. To do this, for example, a checker pattern is written in each memory cell to determine whether the data is "1" or "0".

However, when, e.g., only the write time is taken into consideration, it is required to ensure a write time of Tw×2 m×2 n where Tw is the write time per bit, $\underline{m}$ is the number of columns, and $\underline{n}$ is the number of rows.

When the test process in mass production is taken into consideration, defective bits are preferably detected in the early stages. If a defective bit cannot be replaced with a redundant cell, the chip must be excluded as defective.

BRIEF SUMMARY OF THE INVENTION

According to an aspect of the present invention, there is provided a magnetic random access memory comprising a memory cell array in which magneto-resistive elements are arranged in a matrix, a write word line arranged on each row of the memory cell array, a write bit line arranged on each column of the memory cell array, a first driver and second driver which are connected to one end of the write word lines respectively, the second driver having a higher driving capability than the first driver, a first sinker which is connected to the other end of the write word lines, a pair of third drivers one of which is connected to the write bit lines at one end thereof and the other of which is connected to the write bit lines at the other end thereof, a pair of fourth drivers one of which is connected to the write bit lines at one end thereof and the other of which is connected to the write bit lines at the other end thereof, the pair of fourth drivers having a higher driving capability than the pair of third driver, a pair of second sinkers one of which is connected to the write bit lines at one end thereof and the other end of which is connected to the write bit lines at the other end thereof, a first circuit configured to cause the second driver and first sinker to write information in a plurality of memory cells at a time by a one-axis writing in an axis of hard magnetization, and a second circuit configured to cause one of the fourth driver and one of second sinker to write information in a plurality of memory cells by the one-axis writing in an axis of easy magnetization and simultaneously supply a larger current than that in a two-axis write in a normal operation.

According to another aspect of the present invention, there is provided a test method for a magnetic random access memory, comprising executing a write in a memory cell having a magneto-resistive element by a one-axis write along an axis of easy magnetization by a write bit line, supplying a larger current than that in a two-axis write in a normal operation to a write word line by the one-axis write along an axis of hard magnetization, and reading out a resistance value of the memory cell.

BRIEF DESCRIPTION OF THE SEVERAL VIEWS OF THE DRAWING

FIG. 15 is a plan view showing a transfer apparatus to transfer data to an MRAM card;

FIG. 16 is a sectional view showing the transfer apparatus to transfer data to an MRAM card;

DETAILED DESCRIPTION OF THE INVENTION

[First Embodiment]

Figure 2:
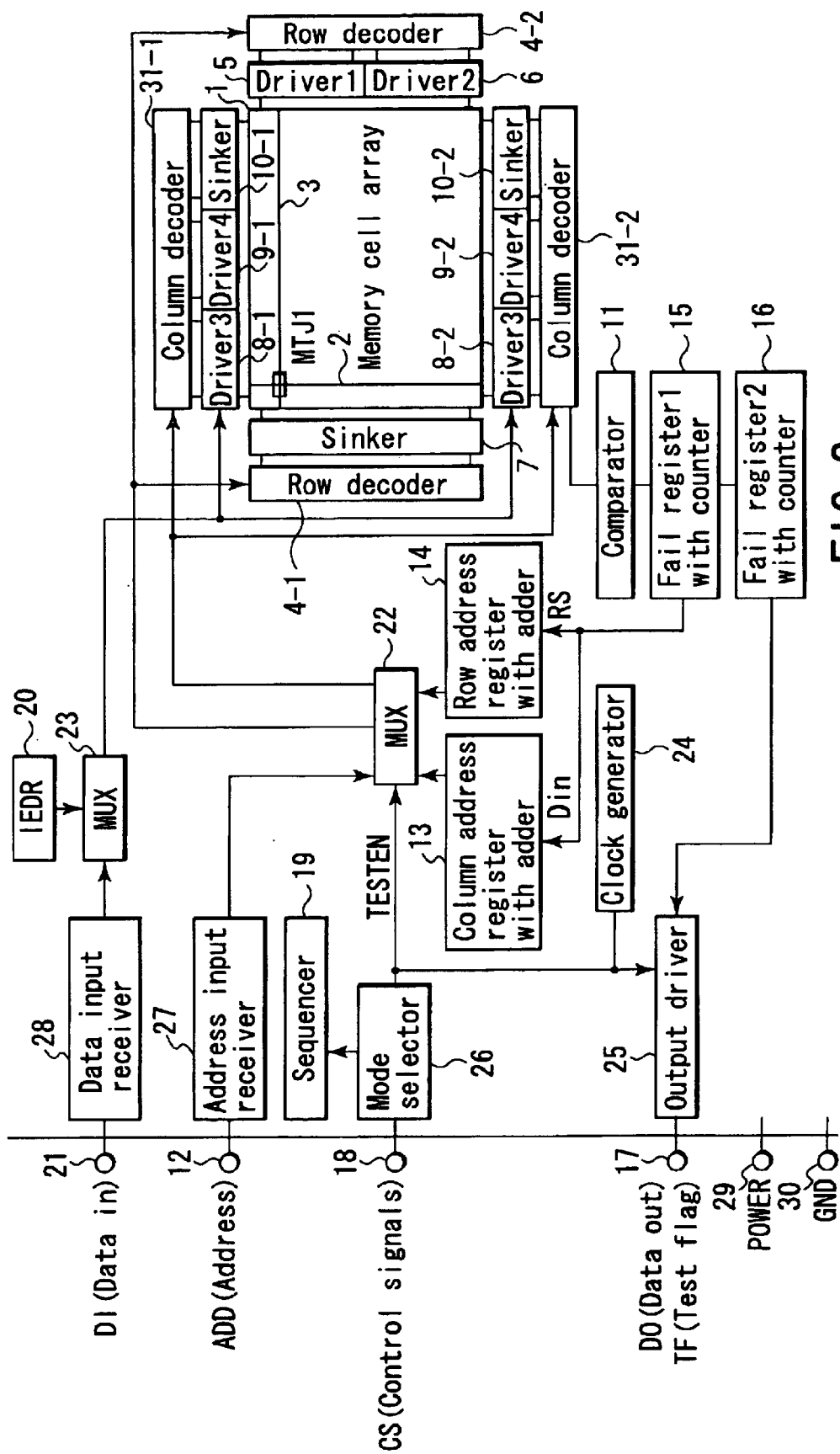
FIG. 2 is a block diagram showing an MRAM having an internal test circuit which detects a memory cell having a shift in write characteristics so as to explain a magnetic random access memory according to the first embodiment of the present invention and a test method therefor.

FIG. 2 is a block diagram showing an MRAM having an internal test circuit which detects a memory cell having a shift in write characteristics so as to explain a magnetic random access memory according to the first embodiment of the present invention and a test method therefor. This MRAM includes a memory cell array 1, row decoders 4-1 and 4-2, a first driver (driver1) 5, a second driver (driver2) 6, a sinker 7, third drivers (driver3) 8-1 and 8-2, fourth drivers (driver4) 9-1 and 9-2, sinkers 10-1 and 10-2, a comparator 11, a column address register 13 with adder, a row address register 14 with adder, a first fail register 15 with counter (fail register1 with counter), a second fail register 16 with counter (fail register2 with counter), a sequencer 19, a write data register (IEDR) 20, a multiplexer circuit (MUX) 22, a multiplexer circuit (MUX) 23, a clock generator 24, an output driver 25, a mode selector 26, an address input receiver 27, a data input receiver 28, and column decoders 31-1 and 31-2.

This MRAM comprises an address signal (external input) terminal 12, a data output (external signal) & test flag (external signal) terminal 17, a control signal (external input) terminal 18, a data input (external signal) terminal 21, a power supply terminal 29, and a ground terminal 30. An address signal ADD (address) is input to the address signal terminal 12. Data DO (Data Out) and a test flag TF (Test Flag) are output from the data output & test flag terminal 17. Control signals CS are input to the control signal terminal 18. Input data DI (Data In) is supplied to the data input terminal 21. A power supply POWER is supplied to the power supply terminal 29. The ground terminal 30 is connected to a ground point GND.

In the memory cell array 1, memory cells MTJ1 each formed from an MTJ element are arrayed in a matrix at the intersections between column lines 2 and row lines 3. In this embodiment, in a write mode for the memory cell MTJ1, a current magnetic field is generated by the column line 2 along the axis of easy magnetization, and a magnetic field is generated by the row line 3 along the axis of hard magnetization. When the memory cell MTJ1 has a shape magnetic anisotropy, the longitudinal direction of the MTJ element is the direction of the row line 3.

The row line 3 is selected by the row decoders 4-1 and 4-2 arranged on both sides of the memory cell array 1. In the write mode, one end of the row line 3 is connected to the first current source (first driver) 5 or second current source (second driver) 6 through the row decoder 4-2 while the other end is connected to the sinker 7 through the row decoder 4-1.

The column line 2 is selected by the column decoders 31-1 and 31-2. In the write mode, the two ends of the column line 2 are connected to the third current sources (third drivers) 8-1 and 8-2, fourth current sources (fourth drivers) 9-1 and 9-2, or sinkers 10-1 and 10-2. In a read mode, the column line 2 is connected to the comparator 11 through the column decoder 31-2 so that readout data is compared with an expected value. In the write mode of normal operation, a synthetic magnetic field is generated for the memory cell MTJ1, which is to be write-accessed, by using the first current source 5 and third current sources 8-1 and 8-2, thereby writing data. The second current source 6 is constituted by a transistor having a higher driving capability than the first current source 5. The fourth current sources 9-1 and 9-2 are constituted by transistors having a higher driving capability than the third current sources 8-1 and 8-2. The fourth current sources 9-1 and 9-2 have a driving capability that allows a write only by the current magnetic field along the axis of easy magnetization.

In the normal operation, the column decoders 31-1 and 31-2 and row decoders 4-1 and 4-2 receive signals in accordance with the address signal ADD given from the outside of the chip. When a test is to be executed, they receive address signals which are output from the column address register 13 with adder and the row address register 14 with adder and selected by the multiplexer circuit 22.

The fail register 15 counts up and holds the number of defective bits on each column line 2. The fail register 16 counts up and holds the number of columns having defective bits in specific number or more. When the value of the fail register 16 reaches a specific value, the fail flag TF is set, and a signal is output from the chip.

The mode selector 26 selects an operation mode upon receiving the external control signal CS. The mode selector 26 switches between a normal memory operation and a test operation in accordance with the level of a test enable signal TESTEN.

Figures 3A, 3B, 3C:
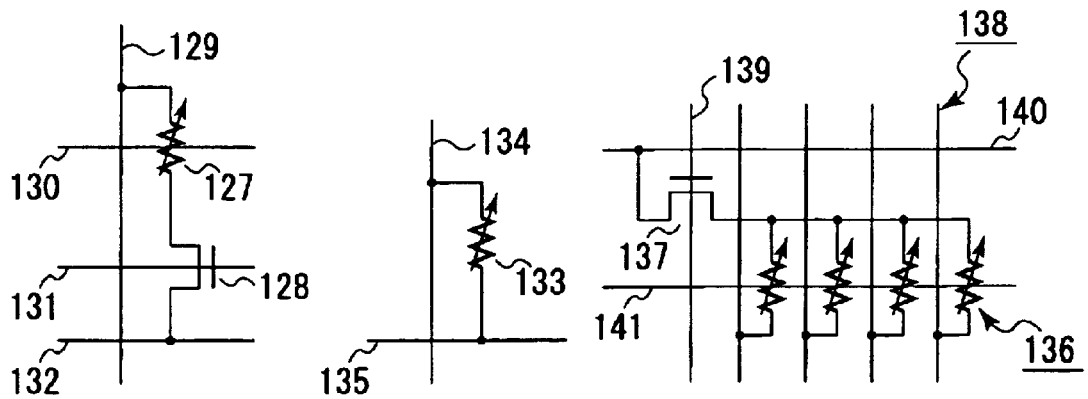
FIGS. 3A to 3C are circuit diagrams showing memory cell structures in the MRAM shown in FIG. 2.

FIGS. 3A to 3C are circuit diagrams showing structures of the memory cell MTJ1 in the MRAM shown in FIG. 2. FIG. 3A shows an example in which the memory cell is formed from a magneto-resistive element (MTJ) 127 and a memory cell select transistor 128. One terminal of the magneto-resistive element 127 is connected to a bit line 129. The other terminal is connected to one end of the current path of the select transistor 128. A write word line 130 is arranged adjacent to the magneto-resistive element 127 in a direction perpendicular to the bit line 129. The other end of the current path of the select transistor 128 is connected to a source line 132. The gate of the select transistor 128 is connected to a read word line 131. The source line 132 and read word line 131 are arranged in parallel to the write word line 130, i.e., in a direction perpendicular to the bit line 129.

FIG. 3B shows a so-called cross-point memory cell which is formed from only a magneto-resistive element (MTJ) 133. One terminal of the magneto-resistive element 133 is connected to a bit line 134 while the other terminal is connected to a word line 135. The bit line 134 and word line 135 are arranged to be perpendicular to each other.

FIG. 3C shows a multilayered-bit-line memory cell which is formed from a plurality of magneto-resistive elements (MTJ) 136 (four magneto-resistive elements in this example) and a select transistor (string switch) 137. One terminal of each of the magneto-resistive elements 136 is connected to a corresponding one of different read word lines (write bit lines) 138. The other terminal is commonly connected to one end of the current path of the select transistor 137. A write word line 141 is arranged adjacent to the magneto-resistive elements 136 in a direction perpendicular to the read word lines (write bit lines) 138. The other end of the current path of the select transistor 137 is connected to a main bit line 140. The gate of the select transistor 137 is connected to a string line 139. The main bit line 140 is arranged in a direction perpendicular to the read word lines (write bit lines) 138. The string line 139 is arranged in parallel to the read word lines (write bit lines) 138.

Figure 4:
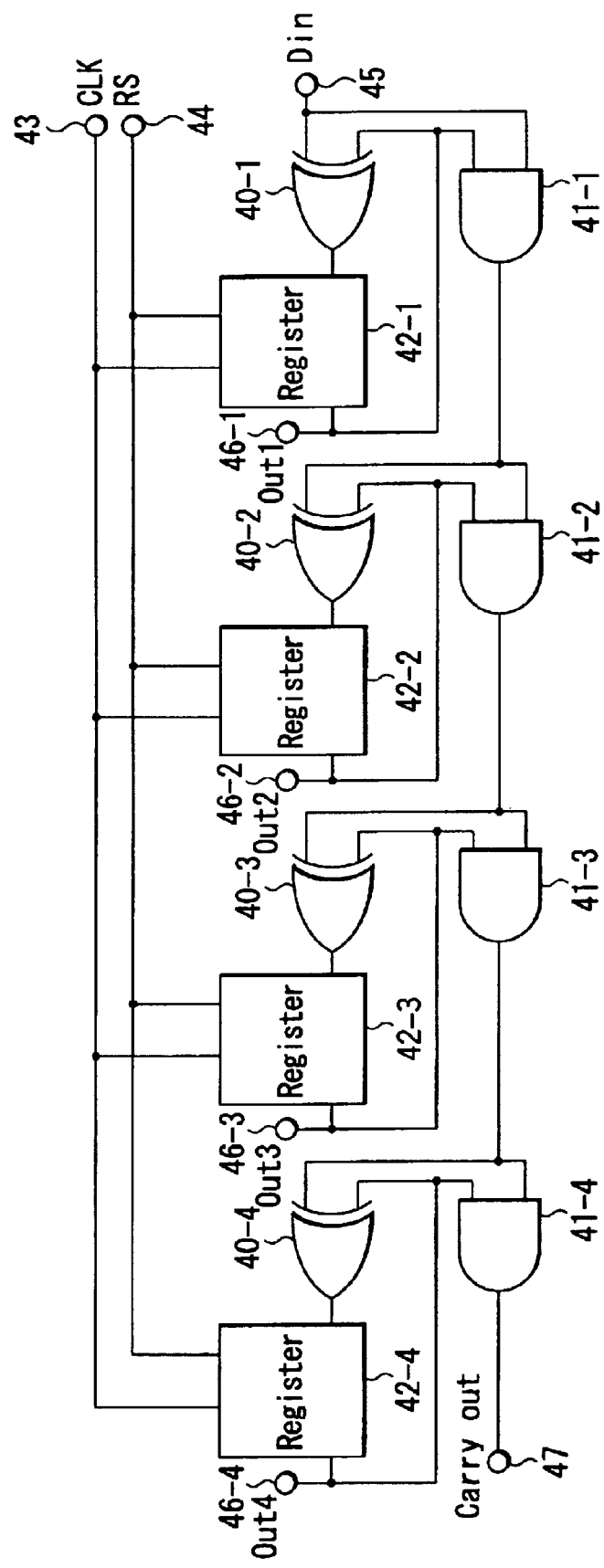
FIG. 4 is a circuit diagram showing the detailed arrangement of a row address register with adder or a column address register with adder in the MRAM shown in FIG. 2.

FIG. 4 is a circuit diagram showing the detailed circuit arrangement of the row address register 14 with adder or column address register 13 with adder in the MRAM shown in FIG. 2. The address registers 14 and 13 basically have the same circuit arrangement. Each address register is constituted by exclusive OR circuits 40-1 to 40-4, AND circuits 41-1 to 41-4, and register circuits (registers) 42-1 and 42-4. An input signal Din is input from an input terminal 45 to one input terminal of each of the exclusive OR circuit 40-1 and AND circuit 41-1 at the first stage. The output terminal of the register circuit 42-1 and an output terminal 46-1 are connected to the other input terminal of each of the exclusive OR circuit 40-1 and AND circuit 41-1 at the first stage. The output terminal of the exclusive OR circuit 40-1 is connected to the input terminal of the register circuit 42-1. The register circuit 42-1 operates in response to a clock signal CLK supplied to a clock terminal 43 and is reset by a reset signal RS supplied to a reset terminal 44.

The output signal from the AND circuit 41-1 is supplied to one input terminal of each of the exclusive OR circuit 40-2 and AND circuit 41-2 at the second stage. The output terminal of the register circuit 42-2 and an output terminal 46-2 are connected to the other input terminal of each of the exclusive OR circuit 40-2 and AND circuit 41-2. The output terminal of the exclusive OR circuit 40-2 is connected to the input terminal of the register circuit 42-2. The register circuit 42-2 operates in response to the clock signal CLK supplied to the clock terminal 43 and is reset by the reset signal RS supplied to the reset terminal 44.

The output signal from the AND circuit 41-2 is supplied to one input terminal of each of the exclusive OR circuit 40-3 and AND circuit 41-3 at the third stage. The output terminal of the register circuit 42-3 and an output terminal 46-3 are connected to the other input terminal of each of the exclusive OR circuit 40-3 and AND circuit 41-3. The output terminal of the exclusive OR circuit 40-3 is connected to the input terminal of the register circuit 42-3. The register circuit 42-3 operates in response to the clock signal CLK supplied to the clock terminal 43 and is reset by the reset signal RS supplied to the reset terminal 44.

The output signal from the AND circuit 41-3 is supplied to one input terminal of each of the exclusive OR circuit 40-4 and AND circuit 41-4 at the final stage. The output terminal of the register circuit 42-4 and an output terminal 46-4 are connected to the other input terminal of each of the exclusive OR circuit 40-4 and AND circuit 41-4. The output terminal of the exclusive OR circuit 40-4 is connected to the input terminal of the register circuit 42-4. The register circuit 42-4 operates in response to the clock signal CLK supplied to the clock terminal 43 and is reset by the reset signal RS supplied to the reset terminal 44.

In each of the address registers 13 and 14 with adders, the exclusive OR circuits 40-1 to 40-4 and AND circuits 41-1 to 41-4 add values, and the register circuits 42-1 and 42-4 hold the values at the respective levels. Output signals out1 to out4 are output from the output terminals 46-1 to 46-4. A carry out signal is output from a carry terminal 47.

The circuit arrangement shown in FIG. 4 can also be applied to the fail registers 15 and 16 with counters.

Figure 5:
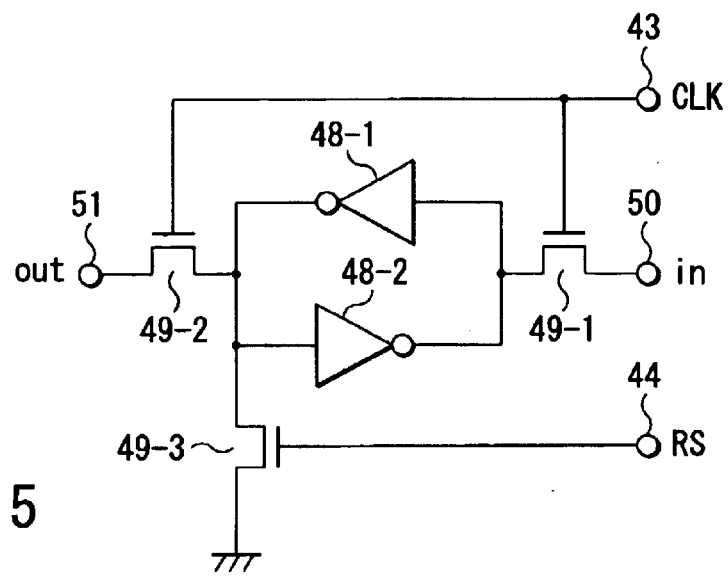
FIG. 5 is a circuit diagram showing the detailed structure of a register circuit in the circuit shown in FIG. 4.

FIG. 5 shows the detailed structure of each of the register circuits 42-1 and 42-4 in the circuit shown in FIG. 4. This circuit includes inverter circuits 48-1 and 48-2 and NMOS transistors 49-1 to 49-3. The input terminal of the inverter circuit 48-1 is connected to the output terminal of the inverter circuit 48-2. The output terminal of the inverter circuit 48-1 is connected to the input terminal of the inverter circuit 48-2. The current path of the NMOS transistor 49-1 is connected between an input terminal 50 and the input terminal of the inverter circuit 48-1. The current path of the NMOS transistor 49-2 is connected between an output terminal 51 and the input terminal of the inverter circuit 48-2. The gates of the NMOS transistors 49-1 and 49-2 are connected to the clock terminal 43 to which the clock signal CLK is supplied. The current path of the NMOS transistor 49-3 is connected between the ground point and the input terminal of the inverter circuit 48-2. The gate of the NMOS transistor 49-3 is connected to the reset terminal 44 to which the reset signal RS is supplied.

Data in supplied to the input terminal 50 is latched in response to the clock signal CLK and output from the output terminal 51 as an output signal out in response to the clock signal CLK. When the reset signal RS is input, the NMOS transistor 49-3 is turned on to reset the latched data.

Figure 6:
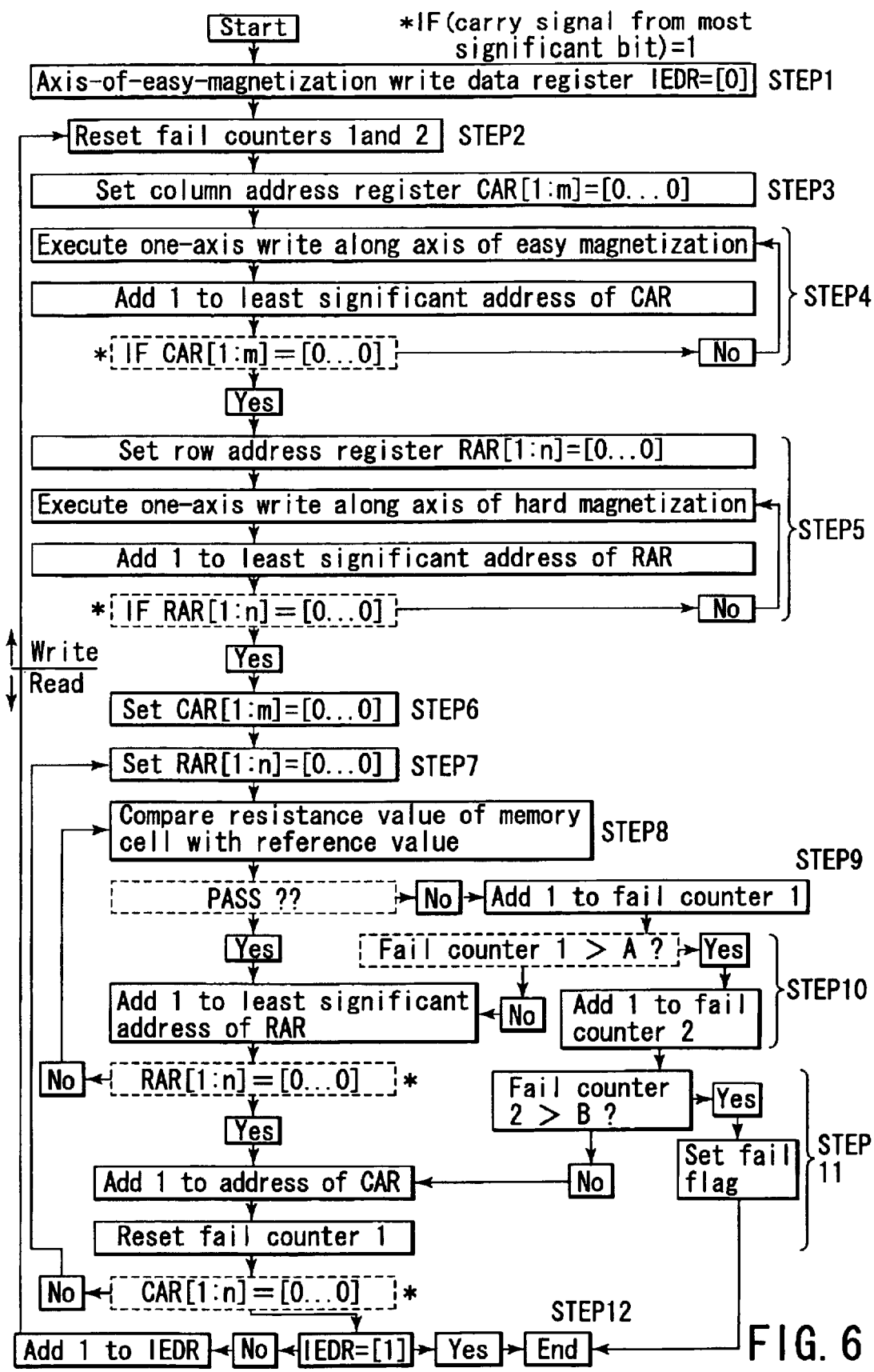
FIG. 6 is a flowchart showing the operation of the test circuit in the MRAM shown in FIGS. 2, 3A, 3B, 3C, 4 and 5.

FIG. 6 is a flowchart showing the operation of the test circuit in the MRAM shown in FIGS. 2, 3A, 3B, 3C, 4 and 5. First, the signal TESTEN output from the mode selector 26 is set to "1" level by the control signal CS to set the test mode.

Subsequently, "0" is set in the write data register 20 (STEP 1). The fail registers 15 and 16 are reset (STEP 2) or the column address register 13 is reset (STEP 3). Currents are supplied to the fourth driver 9-1 and sinker 10-2 or the fourth driver 9-2 and sinker 10-1 to write "0" in all bits on column address 1. Direction of this current depends on the magnetization direction of pin layer in MTJ. Then, "0" is written in all memory cells while incrementing the value of the column address register 13 (STEP 4). In the normal operation, the multiplex circuit 23 is caused to select data to be written in the memory cells on the basis of the input data DI.

Figure 1A:
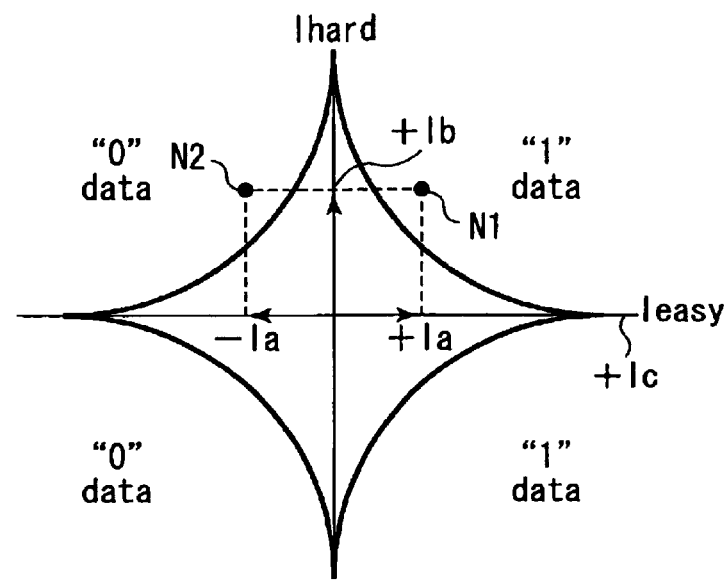
FIG. 1A is a graph showing an asteroid characteristic in an MRAM.
Figure 1B:
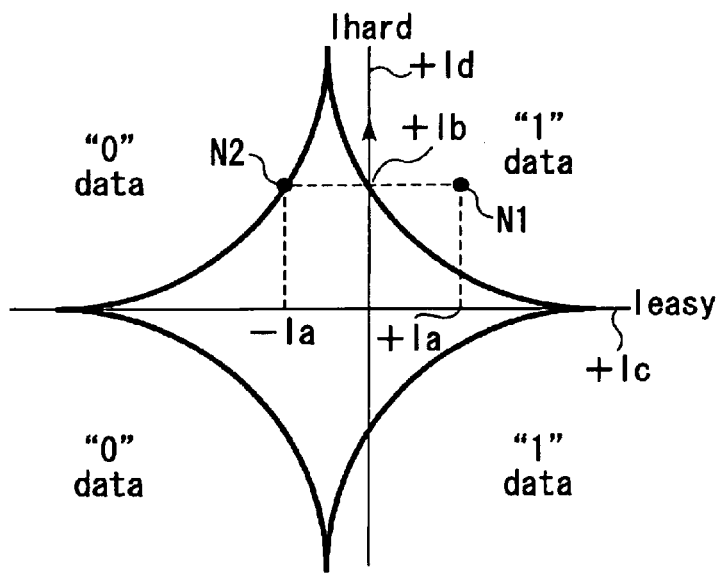
FIG. 1B is a graph showing a shifted asteroid characteristic.

When the write is ended, the row address register 14 is reset. A current is supplied to the row line 3 using the fourth driver 6 and sinker 7 to generate a magnetic field along the axis of hard magnetization in all bits on row address 1. At this time, data in a bit having the asteroid characteristic as shown in FIG. 1A does not change. However, data in a bit whose asteroid characteristic has a shift on the "0" side, as shown in FIG. 1B, changes to "1". This operation is applied to all rows while incrementing the row address (STEP 5).

Figure 7:
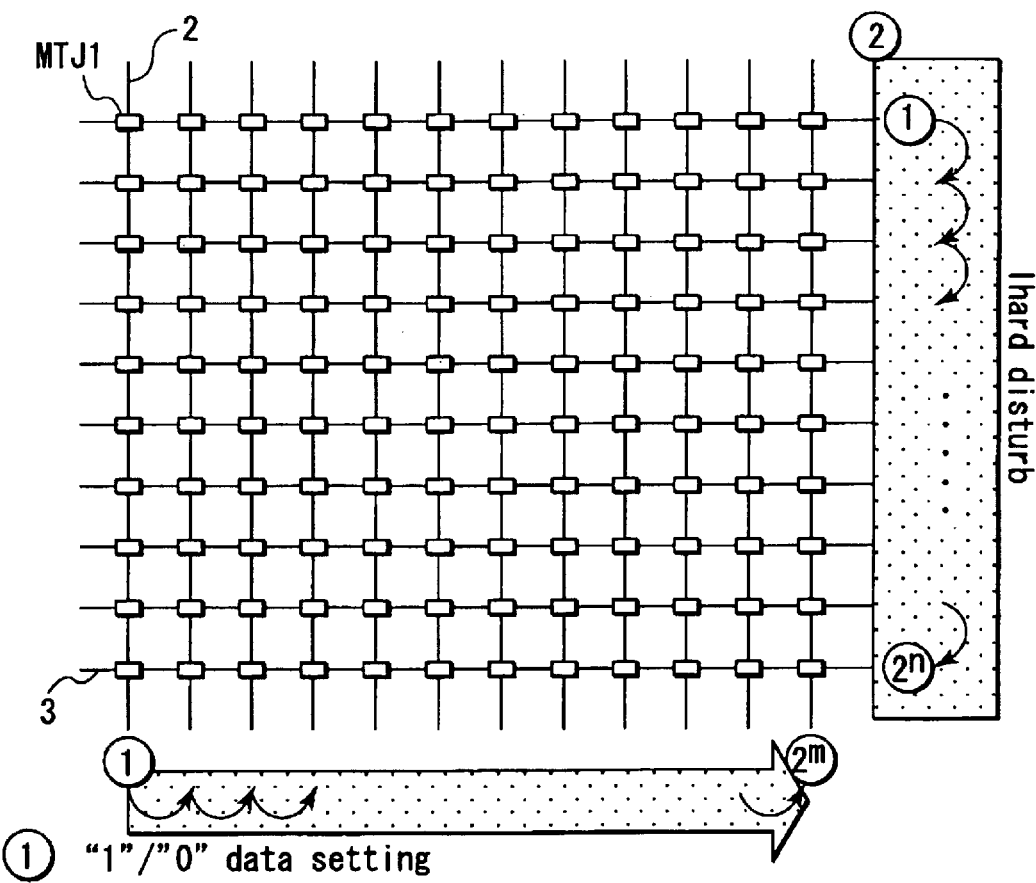
FIG. 7 is a view showing an example in which currents are supplied to a column line and a row line in executing STEP 4.

FIG. 7 schematically shows an example in which currents are supplied to the above-described column line 2 and row line 3. In this example, first, the column lines 2 (column addresses 1 to $2^m$) are sequentially selected, and "1"/"0" data is set by executing a one-axis write along the axis of easy magnetization $2^m$ times. Next, the row lines 3 (row addresses 1 to $2^n$) are set, and a disturbance current is sequentially supplied by a one-axis write along the axis of hard magnetization.

Subsequently, a read from the memory cells and data comparison are executed in accordance with the following procedures. First, both the column address register 13 and the row address register 14 are reset (STEP 6 and STEP 7). Comparison is executed to check whether the data remains "0" while fixing the column address and incrementing the row address (STEP 8). If the data changes to "1", the fail register 15 is incremented every bit count (STEP 9). When the value of the fail register 15 coincides with a specific value A, the fail register 16 is further incremented (STEP 10). That is, the number of columns whose number of fail bits coincides with the specific value A is stored in the fail register 16.

In addition, when the value of the fail register 16 reaches a specific value B, a fail flag is set by the output driver 25. The chip is determined as defective (STEP 11).

Each of the specific values A and B is determined in advance in consideration of the number of redundant rows and the number of columns.

The write data register 20 is set to "1", and the same procedures as described above are repeated (STEP 12). With this processing, bits whose write characteristics shifts to the "1" side can be extracted.

When the test circuit is operated in this way, not only each bit whose resistance value falls outside the standards but also each bit having a shift in write characteristics can easily be extracted in a short time. Hence, a defective chip can be found in the early stages.

If the axis of easy magnetization of memory cells replaces the axis of hard magnetization, the row lines, column lines, decoders, drivers, and sinkers are replaced.

[Second Embodiment]

Figure 8:
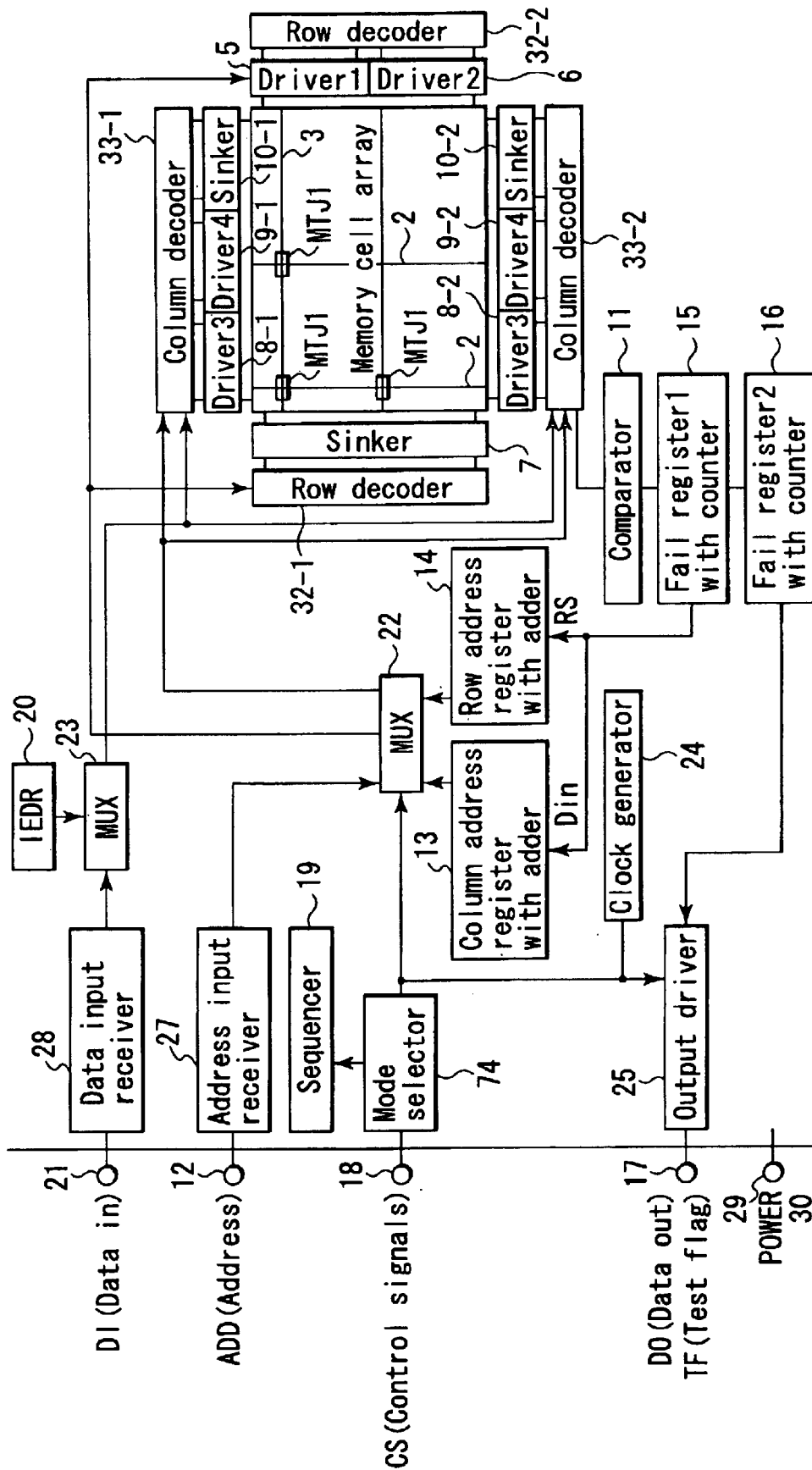
FIG. 8 is a block diagram showing an MRAM having an internal test circuit which detects a memory cell having a shift in write characteristics so as to explain a magnetic random access memory according to the second embodiment of the present invention.

FIG. 8 is a block diagram showing an MRAM having an internal test circuit which detects a memory cell having a shift in write characteristics so as to explain a magnetic random access memory according to the second embodiment of the present invention and a test method therefor. The components of the second embodiment are the same as in the first embodiment except row decoders 32-1 and 32-2 and column decoders 33-1 and 33-2. The same reference numerals as in the first embodiment denote the same parts in the second embodiment, and a detailed description thereof will be omitted.

More specifically, the row decoders 32-1 and 32-2 and column decoders 33-1 and 33-2 are configured to simultaneously select a plurality of column or row addresses to simultaneously select a plurality of memory cells MTJ.

Figure 9:
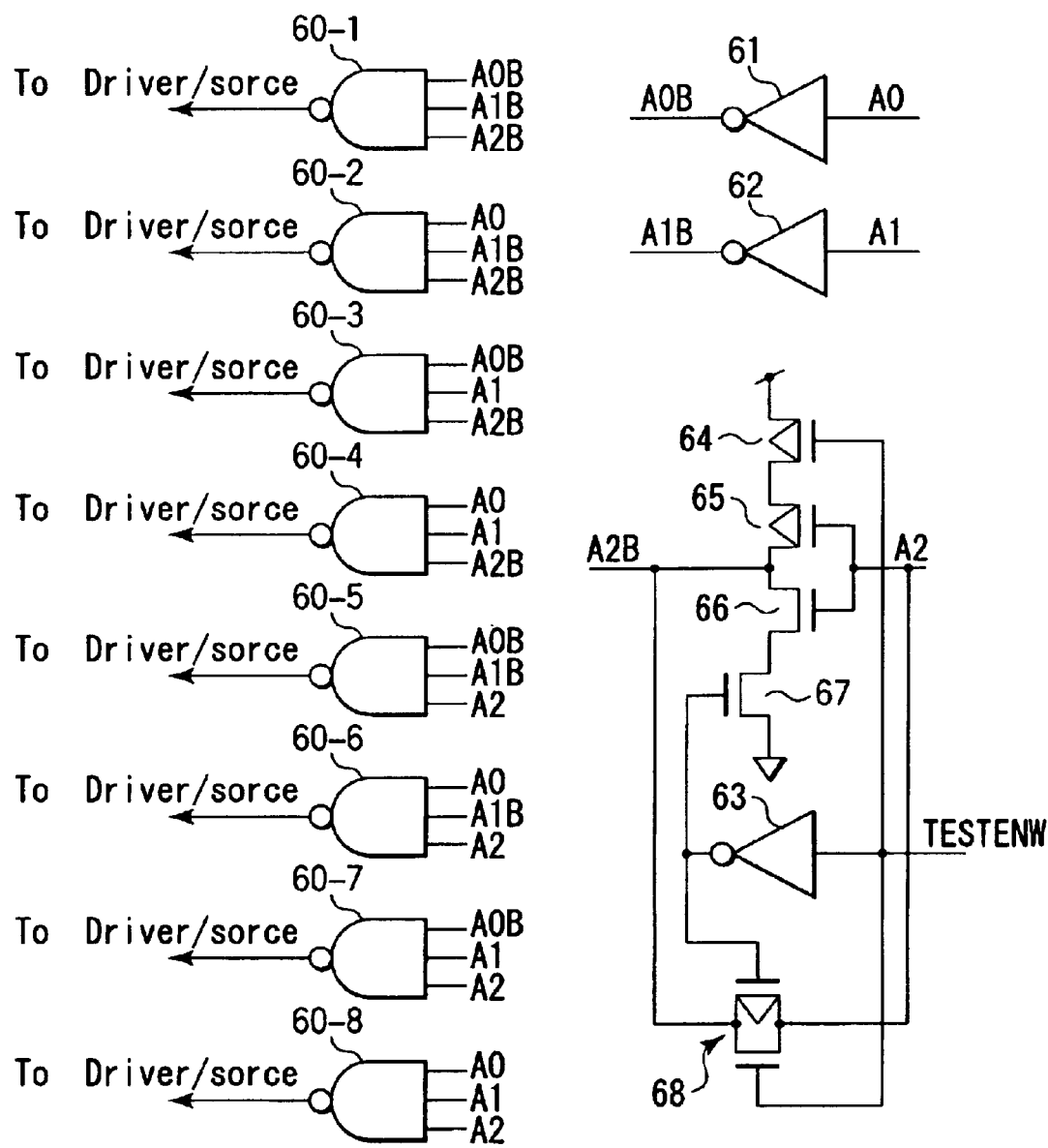
FIG. 9 is a circuit diagram showing a detailed structure of a decoder circuit in the second embodiment.

FIG. 9 shows a detailed structure of the row decoders 32-1 and 32-2 or column decoders 33-1 and 33-2 in this embodiment. This circuit includes NAND circuits 60-1 to 60-8, inverter circuits 61 to 63, PMOS transistors 64 and 65, NMOS transistors 66 and 67, and a transfer gate 68. A least significant address signal bit A0 is supplied to the inverter circuit 61 so that an inverted signal bit A0B is generated. A second address signal bit A1 from the least significant bit is supplied to the inverter circuit 62 so that an inverted signal bit A1B is generated. When a signal TESTENW is "0" level, the PMOS transistor 64 and NMOS transistor 67 are turned on. Since the transfer gate 68 is closed, a third address signal bit A2 from the least significant bit is supplied to the inverter circuit formed from the PMOS transistor 65 and NMOS transistor 66 so that an inverted signal bit A2B is generated.

On the other hand, when the signal TESTENW changes to "1" level, the PMOS transistor 64 and NMOS transistor 67 are turned off. Since the transfer gate 68 is opened, the address bit A2=A2B.

The address bits A0 to A2 and A0B to A2B are selectively supplied to the NAND circuits 60-1 to 60-8. The driving signal for a column line 2 or row line 3 is output from the NAND circuits 60-1 to 60-8.

When the signal TESTENW is "0" level, a normal decoding operation is performed. When the signal TESTENW is "1" level, A2=A2B. Hence, a combination of two column or row addresses that are separated farthest are simultaneously selected.

As described above, when a circuit which changes the signal TESTENW to "1" level (a circuit which generates the signal TESTENW) only in the one-axis write operation by a column or row is arranged, the write time can be halved as compared to the first embodiment. The reason is as follows. When the number of columns is 2 m, the number of times of incrementing a column address register 13 is normally $2^{m-1}$. However, the number of times of incrementing can be reduced to "$2^{(m-1)-1}$" in the second embodiment.

The read operation is the same as in the first embodiment.

The number of column or row addresses to be simultaneously selected is not limited to two. Three or more column or row addresses may be simultaneously selected. However, when the number of addresses to be simultaneously selected is increased, the write current increases. If the current is required to be small, the number of addresses to be simultaneously selected cannot be so large. The number of addresses to be simultaneously selected is set in accordance with the required current consumption characteristic.

[Third Embodiment]

Figure 10:
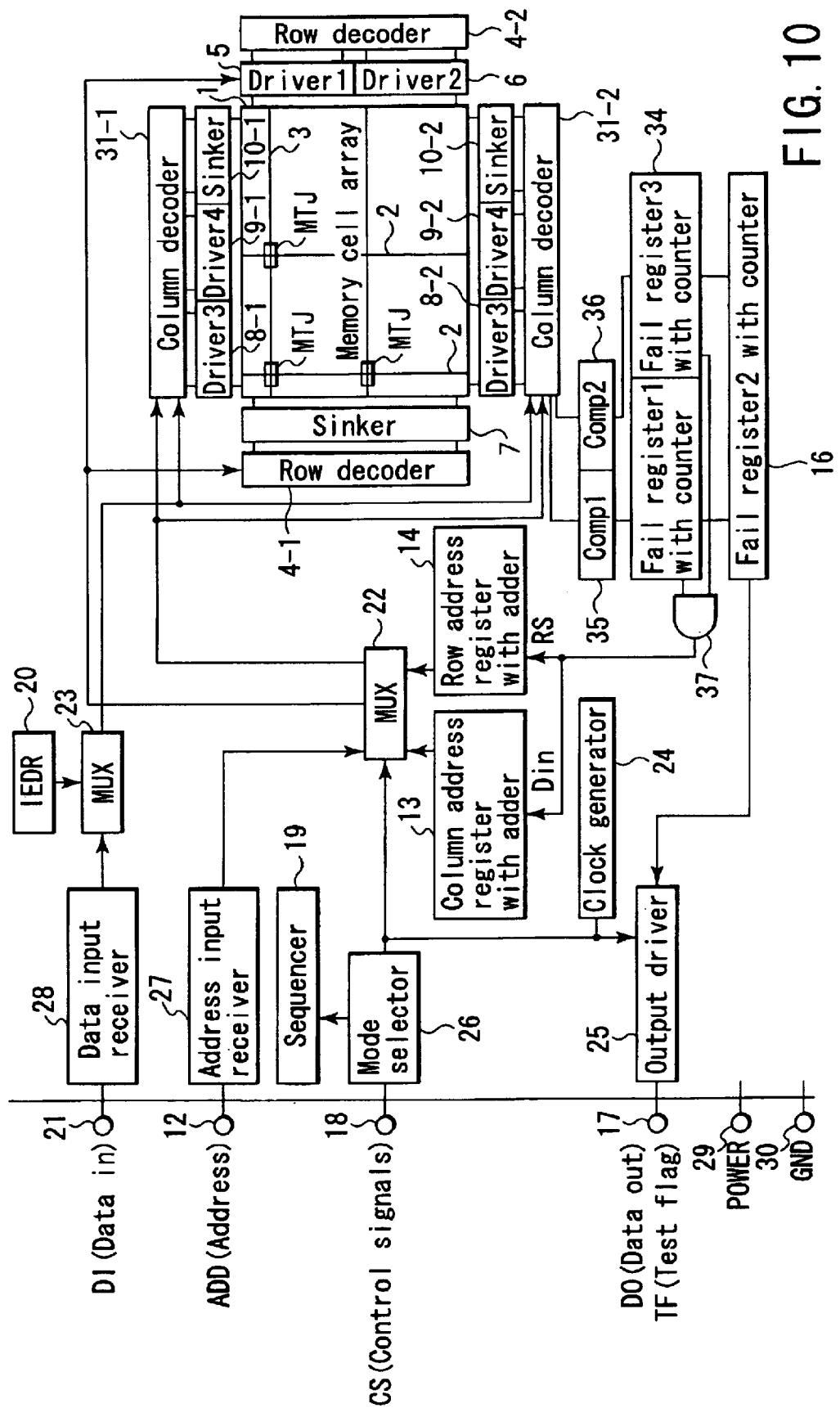
FIG. 10 is a block diagram showing an MRAM having an internal test circuit which detects a memory cell having a shift in write characteristics so as to explain a magnetic random access memory according to the third embodiment of the present invention and a test method therefor.

FIG. 10 is a block diagram showing an MRAM having an internal test circuit which detects a memory cell having a shift in write characteristics so as to explain a magnetic random access memory according to the third embodiment of the present invention and a test method therefor. In this embodiment, a memory cell has a 1-transistor 1-MTJ structure or a cross-point structure having multilayered bit lines so that a plurality of bits can simultaneously be read-accessed.

The write is the same as in the first and second embodiments. The third embodiment is different from the above embodiments in the structure for the read.

The circuit shown in FIG. 10 has an arrangement capable of simultaneously read-accessing 2-bit memory cells. More specifically, a first fail register 15 with counter (fail register1 with counter) and a third fail register 34 with counter (fail register3 with counter), which count the number of bits in each column. The time required for the read can be shortened as compared to the first and second embodiments. The circuit also has a first comparator (comp1) 35 and second comparator (comp2) 36 corresponding to the fail registers 15 and 34. The outputs from the fail registers 15 and 34 are supplied to address registers 13 and 14 through an AND circuit 37.

Figure 11:
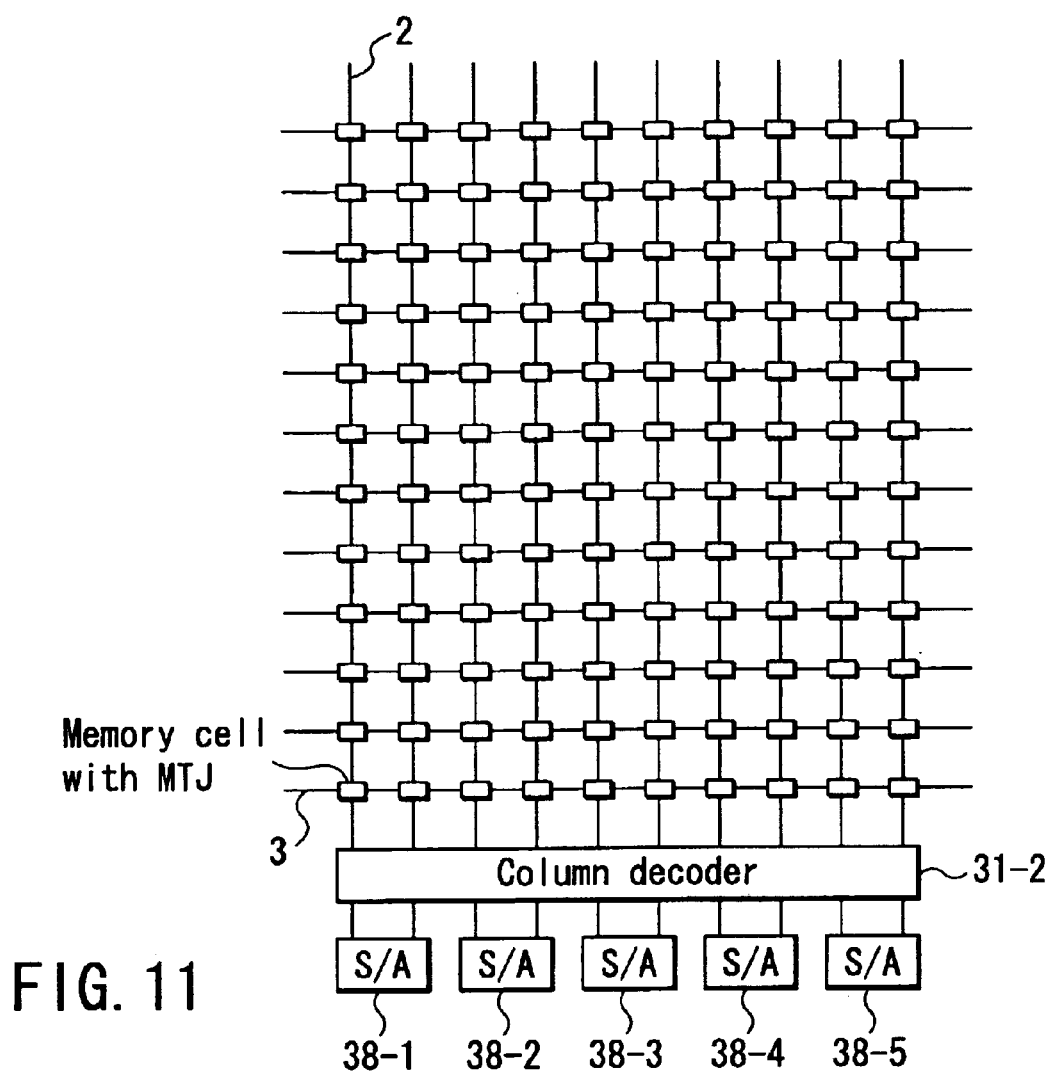
FIG. 11 is a plan view showing a layout example of sense amplifiers in the third embodiment.
Figure 14:
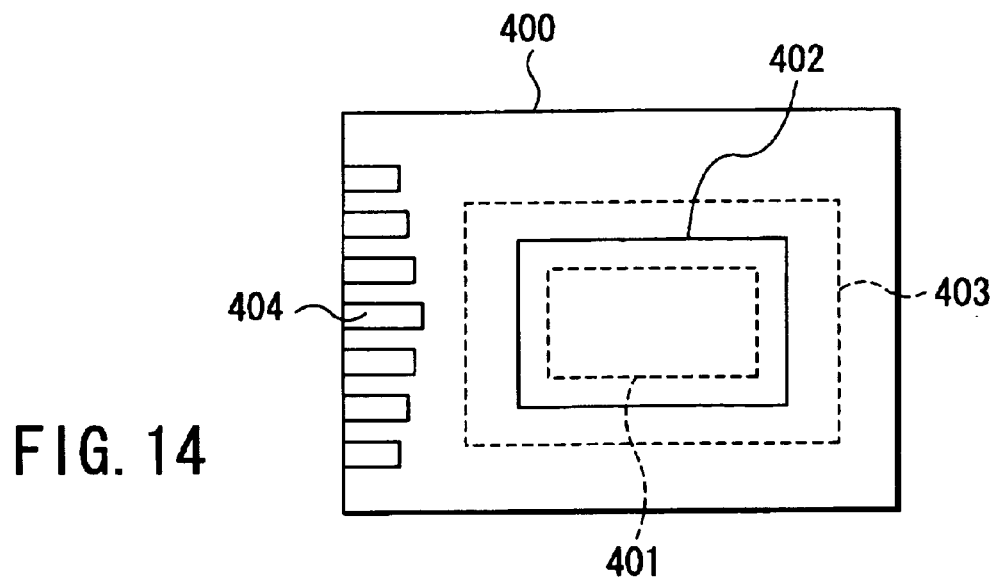
FIG. 14 is a plan view showing an example in which an MRAM is applied to a card (MRAM card) as a smart medium which stores media contents so as to explain Application Example 3 of the MRAMs according to the first to third embodiments of the present invention.

FIG. 11 shows a layout example of sense amplifiers in this embodiment. As shown in FIG. 11, each of sense amplifiers (SA) 38-1 to 38-5 is arranged in correspondence with two adjacent column lines 2.

Even with this arrangement, the same functions and effects as in the first and second embodiments can be obtained.

According to the MRAM of each of the first to third embodiments, the following effects (a) to (f) can be obtained.

(a) The write in a memory cell is executed by the one-axis write by the write bit line. A disturbance current is supplied to the write word line by the one-axis write, and the resistance value is read out. With this operation, a bit having a shift in write characteristics can be detected in a short test time. Accordingly, a bit that is weak against disturbance can be detected in a shorter test time.

(b) When registers having an addition function for column and row addresses are mounted on the chip, it can be tested while automatically generating addresses.

(c) When a plurality of bit lines to be write-accessed and a plurality of word lines to which a disturbance current can be simultaneously supplied are set, the test time can be further shortened.

(d) When two fail registers are prepared, a chip that cannot be remedied even by a redundant cell can be detected in the early stages.

(e) When a plurality of memory cells are simultaneously read-accessed, and fail registers are prepared for the respective bit lines, the time required for the read in the test time can be shortened.

(f) The memory cell can be applied to various kinds of structures such as "1 transistor+1 magneto-resistive element", "cross-point structure formed from only a magneto-resistive element", and "multilayered-bit-line structure including 1 transistor+a plurality of magneto-resistive elements".

The magnetic random access memories according to the above-described first to third embodiments of the present invention can be applied to various apparatuses. FIGS. 12 to 18 show some application examples.

(Application Example 1)

Figure 12:
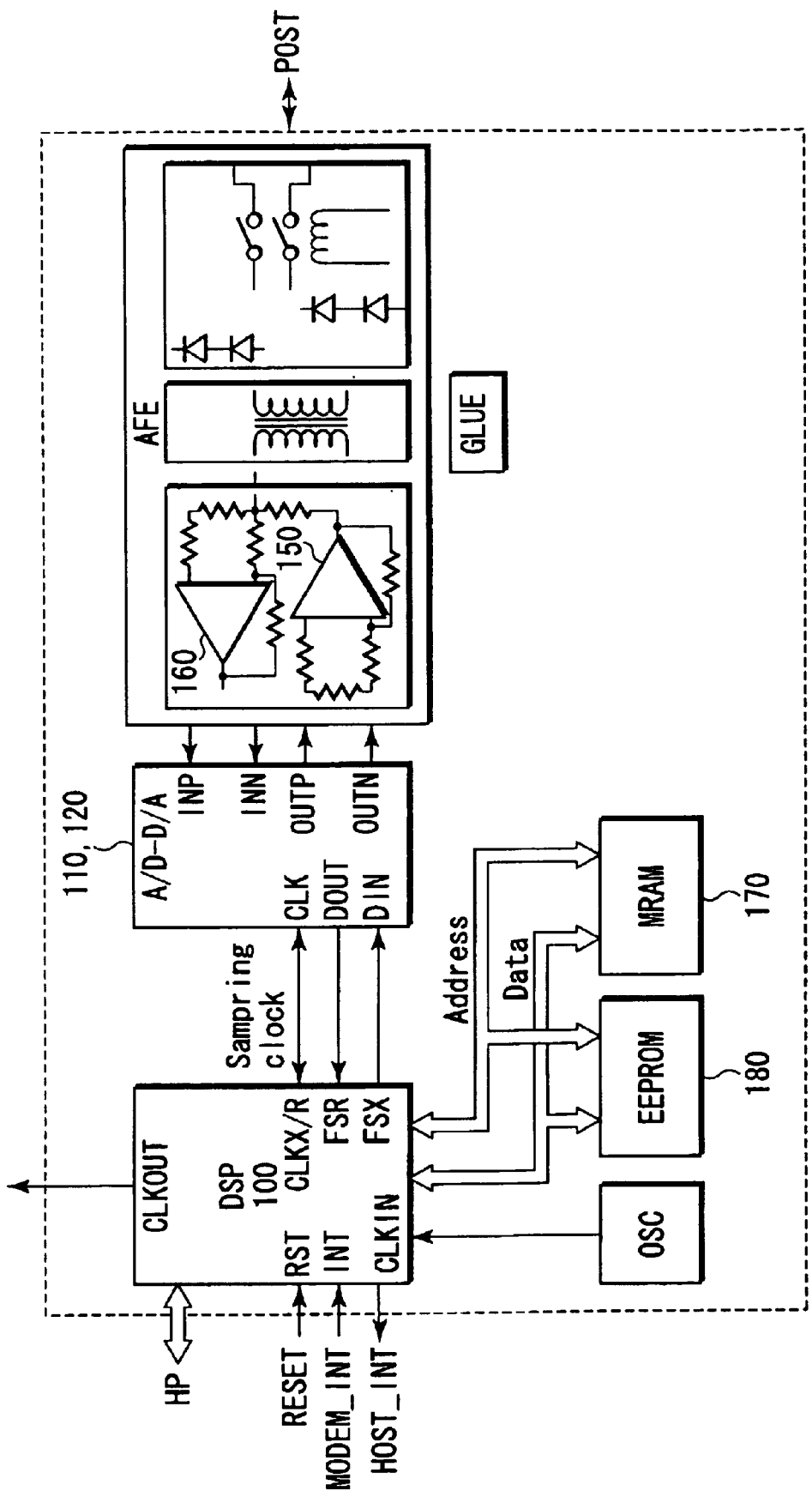
FIG. 12 is a block diagram showing the DSL (Digital Subscriber Line) data path portion of a DSL modem so as to explain Application Example 1 of the MRAMs according to the first to third embodiments of the present invention.

FIG. 12 shows the DSL (Digital Subscriber Line) data path portion of a DSL modem. This modem includes a programmable digital signal processor (DSP) 100, analog-to-digital (A/D) converter 110, digital-to-analog (D/A) converter 120, transmission driver 150, and receiver amplifier 160. FIG. 12 does not illustrate a bandpass filter. Instead, a magnetic random access memory 170 according to one of the embodiments and an EEPROM 180 are illustrated as optional memories of various types to hold a line code program (a program which is executed by the DSP to select and operate a modem in accordance with encoded subscriber line information and transmission conditions (line code; QAM, CAP, RSK, FM, AM, PAM, DWMT, and the like)).

In Application Example 1, two kinds of memories, i.e., the magnetic random access memory 170 and EEPROM 180 are used as memories to hold the line code program. The EEPROM 180 may be replaced with a magnetic random access memory. That is, instead of using two types of memories, only magnetic random access memories may be used.

(Application Example 2)

Figure 13:
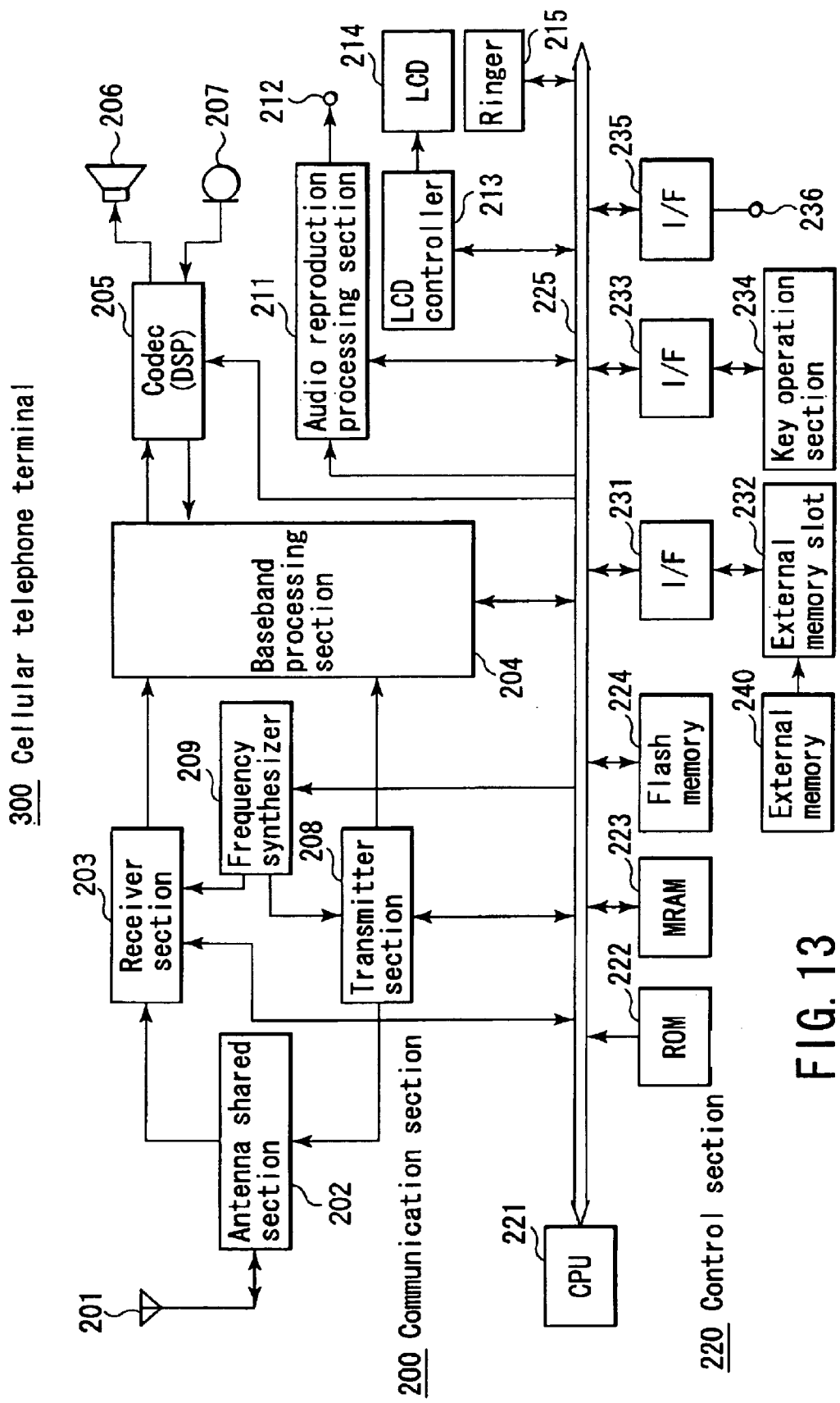
FIG. 13 is a block diagram showing a cellular telephone terminal so as to explain Application Example 2 the MRAMs according to the first to third embodiments of the present invention.

FIG. 13 shows a cellular telephone terminal 300 as another application example. A communication section 200 which implements a communication function comprises a transmitting/receiving antenna 201, an antenna shared section 202, a receiver section 203, a baseband processing section 204, a DSP 205 used as a voice codec, a loudspeaker (receiver) 206, a microphone (transmitter) 207, a transmitter section 208, and a frequency synthesizer 209.

The cellular telephone terminal 300 has a control section 220 which controls the sections of the cellular telephone terminal. The control section 220 is a microcomputer which is formed by connecting a CPU 221, a ROM 222, a magnetic random access memory (MRAM) 223 according to one of the embodiments, and a flash memory 224 through a CPU bus 225. The ROM 222 stores, in advance, a program to be executed by the CPU 221 and necessary data such as fonts to be displayed. The MRAM 223 is mainly used as a work area where the CPU 221 stores, as needed, data midway through calculation during executing the program, or data exchanged between the control section 220 and the respective sections are temporarily stored. Even when the cellular telephone terminal 300 is powered off, the flash memory 224 stores, e.g., the immediately preceding set conditions, so the same set conditions can be used when the cellular telephone terminal is powered on again. Accordingly, even when the cellular telephone terminal is powered off, the stored set parameters are not erased.

The cellular telephone terminal 300 also has an audio reproduction processing section 211, an external output terminal 212, a liquid crystal display (LCD) controller 213, an LCD 214 for display, and a ringer 215 which generates a ringing signal. The audio reproduction processing section 211 reproduces audio information input to the cellular telephone terminal 300 (or audio information stored in an external memory 240 (to be described later)). The audio information that is reproduced can be transmitted to a headphone or a portable loudspeaker through the external output terminal 212 and extracted to the outside. When the audio reproduction processing section 211 is prepared, audio information can be reproduced. The LCD controller 213 receives display information from, e.g., the CPU 221 through the CPU bus 225, converts the display information into LCD control information to control the LCD 214, and drives the LCD 214 to cause it to perform display.

The cellular telephone terminal 300 also has interface circuits (I/Fs) 231, 233, and 235, the external memory 240, an external memory slot 232, a key operation section 234, and an external input/output terminal 236. The external memory slot 232 receives the external memory 240 such as a memory card. The external memory slot 232 is connected to the CPU bus 225 through the interface circuit (I/F) 231. As described above, when the slot 232 is prepared in the cellular telephone terminal 300, information in the cellular telephone terminal 300 can be written in the external memory 240. Alternatively, information (e.g., audio information) stored in the external memory 240 can be input to the cellular telephone terminal 300. The key operation section 234 is connected to the CPU bus 225 through the interface circuit (I/F) 233. Key input information input from the key operation section 234 is transmitted to, e.g., the CPU 221. The external input/output terminal 236 is connected to the CPU bus 225 through the interface circuit (I/F) 233 and functions as a terminal in inputting various kinds of external information to the cellular telephone terminal 300 or outputting information externally from the cellular telephone terminal 300.

In Application Example 2, the ROM 222, MRAM 223, and flash memory 224 are used. The flash memory 224 may be replaced with a magnetic random access memory. The ROM 222 may also be replaced with a magnetic random access memory.

(Application Example 3)

FIGS. 14 to 18 show an example in which a magnetic random access memory is applied to a card (MRAM card) as a smart medium which stores media contents.

An MRAM card main body 400 incorporates an MRAM chip 401. An opening portion 402 is formed in the card main body 400 at a position corresponding to the MRAM chip 401 so the MRAM chip 401 is exposed. The opening portion 402 has a shutter 403. When the MRAM card is carried, the MRAM chip 401 is protected by the shutter 403. The shutter 403 is made of a material such as a ceramic capable of shielding an external magnetic field. When data is to be transferred, the shutter 403 is opened to expose the MRAM chip 401. An external terminal 404 is used to extract content data stored in the MRAM card.

FIGS. 15 and 16 show a transfer apparatus which transfers data to the MRAM card. FIG. 15 is a plan view of a card insertion type transfer apparatus. FIG. 16 is a sectional view of the transfer apparatus. A second MRAM card 450 used by an end user is inserted from an insertion portion 510 of a transfer apparatus 500, as indicated by the arrow, and pushed into until the card abuts against a stopper 520. The stopper 520 also functions as a member to align a first MRAM 550 and the second MRAM card 450. When the second MRAM card 450 is located at a predetermined position, a control signal is supplied from a first MRAM rewrite control section to an external terminal 530. Accordingly, data stored in the first MRAM 550 is transferred to the second MRAM card 450.

Figure 17:
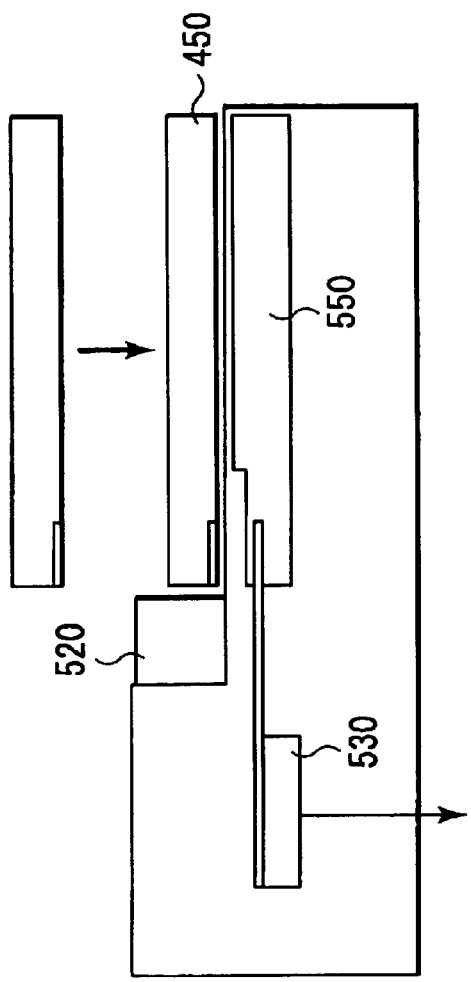
FIG. 17 is a sectional view showing a fitting type transfer apparatus to transfer data to an MRAM card.

FIG. 17 shows a fitting type transfer apparatus. In this transfer apparatus, the second MRAM card 450 is fitted on the first MRAM 550 with reference to the stopper 520, as indicated by the arrow. The transfer method is the same as in the card insertion type, and a description thereof will be omitted.

Figure 18:
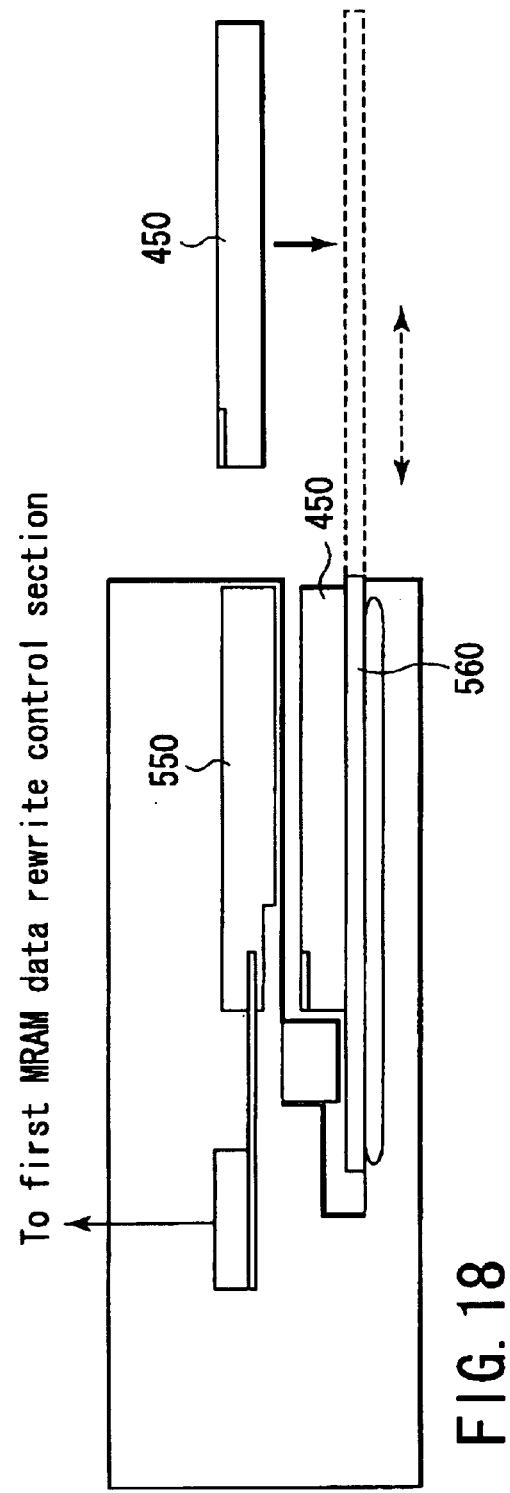
FIG. 18 is a sectional view showing a slide type transfer apparatus to transfer data to an MRAM card.

FIG. 18 shows a slide type transfer apparatus. The transfer apparatus has a sliding tray 560, like a CD-ROM drive or DVD drive. The sliding tray 560 moves, as indicated by the arrow. When the sliding tray 560 moves to the position indicated by the broken line, the second MRAM card 450 is mounted on the sliding tray 560 and conveyed into the transfer apparatus 500. The structure that conveys the second MRAM card 450 until it abuts against the stopper 520 and the transfer method are the same as in the card insertion type, and a description thereof will be omitted.

In the above embodiments, a magnetic random access memory has been described as an example of a semiconductor integrated circuit device. However, the present invention can also be applied to a semiconductor integrated circuit device in which a magnetic random access memory and logic circuit are embedded, or a semiconductor integrated circuit device called a SOC in which a system is mounted in one chip.

As described above, the write in a memory cell is executed by the one-axis write along the axis of easy magnetization by the write bit line. A current (disturbance current) larger than that for the two-axis write in the normal operation is supplied to the write word line by the one-axis write along the axis of hard magnetization, and the resistance value is read out. With this operation, a bit having a shift in write characteristics can be detected in a short test time. Accordingly, a bit that is weak against disturbance can be detected in a short test time.

Hence, according to one aspect of the present invention, a bit having a resistance value other than a predetermined value or a bit having a shift in asteroid characteristic can be detected in early stages in a short test time. A magnetic random access memory which can contribute to increase the throughput and cost reduction in mass production and a test method therefor can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:

a memory cell array in which magneto-resistive elements are arranged in a matrix;

a write word line arranged on each row of the memory cell array;

a write bit line arranged on each column of the memory cell array;

a first driver and second driver which are connected to one end of the write word lines respectively, the second driver having a higher driving capability than the first driver;

a first sinker which is connected to the other end of the write word lines;

a pair of third drivers one of which is connected to the write bit lines at one end thereof and the other of which is connected to the write bit lines at the other end thereof;

a pair of fourth drivers one of which is connected to the write bit lines at one end thereof and the other of which is connected to the write bit lines at the other end thereof, the pair of fourth drivers having a higher driving capability than the pair of third driver;

a pair of second sinkers one of which is connected to the write bit lines at one end thereof and the other end of which is connected to the write bit lines at the other end thereof;

a first circuit configured to cause the second driver and first sinker to write information in a plurality of memory cells at a time by a one-axis write in an axis of hard magnetization; and a second circuit configured to cause one of the fourth drivers and one of second sinkers to write information in a plurality of memory cells by a one-axis write in an axis of easy magnetization and simultaneously supply a larger current than that in a two-axis write in a normal operation.

2. A memory according to claim 1, further comprising a column address register which automatically generates write and read column addresses in executing a test, and a row address register which automatically generates write and read row addresses in executing the test.

3. A memory according to claim 1, further comprising a column address register which automatically generates a plurality of write column addresses in executing a test, a column decoder which simultaneously selects a plurality of column addresses, a row address register which automatically generates a plurality of write row addresses in executing the test, and a row decoder which simultaneously selects a plurality of row addresses.

4. A memory according to claim 1, further comprising a comparator which executes comparison with an expected value after the larger current than that in the two-axis write in the normal operation is supplied, a first fail register which counts and holds the number of inverted bits or the number of bits on each bit line having a resistance value falling outside standards, a second fail register which counts and holds the number of bit lines when a value of the first fail register reaches a specific value, and a third circuit configured to set a fail flag and output a signal from the bit when a value of the second fail register reaches a specific value.

5. A memory according to claim 4, further comprising a comparator which executes comparison with the expected value simultaneously for memory cells connected to a plurality of bit lines after the larger current than that in the two-axis write in the normal operation is supplied, fail registers equal in number to the number of bits to be simultaneously measured, each of the fail registers counting and holding the number of inverted bits or the number of bits on each bit line having the resistance value below the standards, the second fail register which counts and holds the number of bit lines when the value of the fail register reaches a specific value, and the third circuit configured to set the fail flag and output the signal from the bit when the value of the second fail register reaches a specific value.

6. A memory according to claim 1, wherein the memory cell comprises one transistor and one magneto-resistive element.

7. A memory according to claim 1, wherein the memory cell is a cross-point memory cell comprising only a magneto-resistive element.

8. A memory according to claim 1, wherein the memory cell is a multilayered-bit-line memory cell comprising one transistor and a plurality of magneto-resistive elements.

9. A test method for a magnetic random access memory, comprising:

executing a write in a memory cell having a magneto-resistive element by a one-axis write along an axis of easy magnetization by a write bit line;

supplying a larger current than that in a two-axis write in a normal operation to a write word line by a one-axis write along an axis of hard magnetization; and reading out a resistance value of the memory cell.

10. A method according to claim 9, wherein the write by the one-axis write along the axis of easy magnetization by the write bit line is executed simultaneously for a plurality of memory cells.

11. A method according to claim 9, further comprising, after the read of the resistance value of the memory cell, counting the number of bits each having a shift in asteroid characteristic.

12. A method according to claim 11, further comprising, after counting the number of bits each having the shift in asteroid characteristic, determining whether a count value coincides with a specific value.

13. A method according to claim 12, wherein the test is ended when the count value coincides with the specific value.

* * * * *